United States Patent

Fujinoki et al.

[11] Patent Number: 6,031,238
[45] Date of Patent: Feb. 29, 2000

[54] PROJECTION ALIGNER FOR INTEGRATED CIRCUIT FABRICATION

[75] Inventors: Akira Fujinoki; Hiroyuki Nishimura; Toshiki Mori, all of Koriyama, Japan

[73] Assignees: Heraeus Quarzglas GmbH, Hanau, Germany; Shin-Etsu Quartz Products Co., Ltd., Tokyo, Japan

[21] Appl. No.: 09/029,451

[22] PCT Filed: Jun. 30, 1997

[86] PCT No.: PCT/EP97/03406

§ 371 Date: Feb. 26, 1998

§ 102(e) Date: Feb. 26, 1998

[87] PCT Pub. No.: WO98/00761

PCT Pub. Date: Jan. 8, 1998

[30] Foreign Application Priority Data

Jul. 2, 1996 [JP] Japan .................................. 8-191483
Jul. 2, 1996 [JP] Japan .................................. 8-191493
Jul. 2, 1996 [JP] Japan .................................. 8-191515

[51] Int. Cl.[7] .............................. G03F 7/20; G02B 13/14
[52] U.S. Cl. ........................................ 250/492.2; 359/355
[58] Field of Search ........................... 250/492.2; 359/355

[56] References Cited

U.S. PATENT DOCUMENTS 5,488,229  1/1996  Elliott et al. ........................ 250/492.2
5,719,698  2/1998  Hiraiwa et al. ...................... 359/355
5,908,482  6/1999  Komine et al. ....................... 65/17.6

FOREIGN PATENT DOCUMENTS 0401845  12/1990  European Pat. Off. .
3447489   7/1985  Germany .

*Primary Examiner*—Jack I. Berman
*Attorney, Agent, or Firm*—Whitman Breed Abbott & Morgan LLP; Andrew L. Tiajoloff

[57] ABSTRACT

A known projection aligner for integrated circuit fabrication, in which an integrated circuit pattern image is projected on a wafer, comprises an ArF excimer laser and an optical system composed of groups of quartz glass optical members made of synthetic quartz glass. To provide a projection aligner having optical properties, such as durability, optical transmittance and the like, which are not degraded over a long time of operation and the optical system can be constructed at a low cost as a whole, it is suggested that the optical system comprises a first quartz glass optical member group whose hydrogen molecule concentration is in the range between $1\times10^{17}$ and $5\times10^{18}$ molecules/cm$^3$ and a third quartz glass optical member group whose hydrogen molecule concentration is in the range between $5\times10^{18}$ to $5\times10^{19}$ molecules/cm$^3$.

11 Claims, 1 Drawing Sheet

PROJECTION ALIGNER FOR INTEGRATED CIRCUIT FABRICATION

INDUSTRIAL FIELD OF THE APPLICATION

The present invention relates to a projection aligner suitable for fabrication of 64 Mbit to 256 Mbit memory integrated circuits and, more particularly, a projection aligner comprising ArF excimer laser and an optical system composed of quartz glass optical members.

PRIOR ART

An optical lithography, in which a pattern on a mask is transferred on a wafer using light, has widely been used for integrated circuit fabrication with a projection aligner, because the optical lithography is better evaluated in an aspect of cost, as compared with other techniques using such exposing radiation as an electron beam or X-rays.

A projection aligner using an "I-line" having a wavelength of 365 nm emitted from a high-pressure mercury lamp as an optical source has been developed to form a pattern image with a linewidth of 0.5 to 0.4 $\mu$m on a wafer. Such a projection aligner can be used for fabrication of 16 Mbit integrated circuits.

However a resolution power in the range of 0.25 to 0.35 $\mu$m is required in fabrication of 64 to 256 Mbit integrated circuits, which are of a next generation, and even a higher resolution power in the range of 0.13 to 0.20 $\mu$m is required in the case of 1 Gbit integrated circuits. In order to achieve such resolution an ArF laser, especially an ArF excimer laser is used.

However, an optical lithography using an ArF excimer laser as a light source has a various problems and one problem is to achieve optical material good enough to make a lens, mirror and prism, which compose an optical system for image projection.

A choice of optical material for ArF laser light having a wavelength of 193 nm is substantially limited to quartz glass, especially high-purity synthetic quartz glass, because of its excellent transmittance of the ArF laser light. The ArF laser light gives more than 10 times as great a damage to the mass of quartz glass during exposure as KrF light does.

Durability of quartz glass to irradiation of an excimer laser depends on the hydrogen molecule concentration contained in the quartz glass, as disclosed in EP-A2 401 845t. It is disclosed that quartz glass has a sufficient durability to excimer laser irradiation for practical use in a projection aligner with a KrF excimer laser as a light source, when the quartz glass has a concentration of hydrogen molecules of $5 \times 10^{16}$ molecules/cm$^3$ or more. In experiments it has been found that, to minimize the degree of the damage caused by an ArF laser, the hydrogen molecule concentration in the glass should be higher, for example more than $5 \times 10^{18}$ molecules/cm$^3$.

Synthetic quartz glass as material to fabricate optical members, such as a mirror, lens and the like, in various optical systems for optical lithography can be said to have generally been of one kind when considered in terms of hydrogen molecule concentration, since the concentration is a physical quantity to be determined by conditions of synthesis of raw material and/or a following heat treatment (including hydrogen doping) and the physical quantity should generally have a single magnitude, if fluctuations in magnitude thereof, which are ascribed to unintentional minor changes in operational conditions, are neglected due to their smallness.

There are two methods in which hydrogen molecules are incorporated into synthetic quartz glass. A first method is to incorporate hydrogen molecules in an hydrogen containing atmosphere at atmospheric pressure. By this method a maximum concentration of hydrogen molecules in the order $5 \times 10^{18}$ molecules/cm$^3$ can be achieved. A second method is to heat the synthetic quartz glass in a pressurized hydrogen atmosphere to dope with hydrogen molecules. Using this method the maximum concentration of hydrogen molecules can be increased over the value of $5 \times 10^{18}$ molecules/cm$^3$ only by applying a pressure higher than 10 at.

Problem the Invention Seeks to Solve

A temperature of a heat treatment in the range of 200 to 800° C. for doping with hydrogen is preferred to a heating/remelting treatment at higher temperatures since new defects are induced in the bulk of quartz glass by the heating/remelting treatment at high temperatures. However, the heat treatment in the temperature range of 200 to 800° C. has a problem that it takes a very long time to incorporate a lot of hydrogen molecules at a concentration as large as $5 \times 10^{18}$ molecules/cm$^3$ or more into a quartz glass optical member, since the diffusion rate of a hydrogen molecules is low at low temperaturer. Applying of a high pressure involves the problem that homogeneity in refractive index distribution is reduced and/or strains are induced in the bulk by, even if the temperature is as low as 200 to 800° C.

An additional heat treatment is required, when quartz glass is treated in conditions of a high pressure and high temperature because of the above mentioned reasons. Quartz glass with a hydrogen molecule concentration equal to, or more than $5 \times 10^{18}$ molecules/cm$^3$ and with such optical properties as excellent homogeneity in refractive index distribution, a low degree of strains and the like, which may satisfy requirements for optical members composing an optical system of a projection aligner, is very expensive, because such quartz glass is obtained over treatments which are very complex and time-consuming by industrial standards.

According to the teaching from an article authored by Kazuo USHIDA with a title of "Quartz Glass for a Stepper" appeared in New Glass, Vol. 6, No. 2 (1989) pp. 191–196, quality requirements for a lens of a stepper are a transmittance of 99.0%/cm or more, a variation of refractive index ($\Delta$n) of $1 \times 10^{-6}$ or less and a birefringence of 1.00 nm/cm or less. Quartz glass having a refractive index distribution as homogeneous as in the above range cannot be obtained, when hydrogen doping to a concentration as high as $5 \times 10^{18}$ molecules/cm$^3$ is carried out in a pressure treatment.

The present invention has an object to provide a projection aligner, which uses an ArF excimer laser as an optical source, comprising an optical system composed of quartz glass optical members, wherein optical properties, such as durability, optical transmittance and the like, are not degraded over a long time of operation and the optical system can be constructed at a low cost as a whole.

Means to Solve the Problem

As is mentioned above, there have been problems in incorporating hydrogen molecules into the bulk of quartz glass optical members to a hydrogen molecule concentration equal to, or more than $5 \times 10^{18}$ molecules/cm$^3$, which is carried out for the purpose of improvement of durability of an ArF excimer laser projection aligner, since treatments very complex and time-consuming by industrial standards are required for achieving such quartz glass optical members and thereby the projection aligner not only is hard to produce but also becomes very expensive.

When quartz glass is produced so as to meet the above requirement for homogeneity in refractive index distribution, a doped hydrogen molecule concentration as high as in the above mentioned range cannot be attained and thereby a stepper lens made of such quartz glass has a chance of breakage by irradiation of ArF excimer laser light.

A first aspect of the present invention is directed to a projection aligner for integrated circuit fabrication, wherein the optical system is composed of groups of quartz glass optical members comprising a first quartz glass optical member group whose hydrogen molecule concentration is in the range between $1 \times 10^{17}$ and $5 \times 10^{18}$ molecules/cm$^3$ and a third quartz glass optical member group whose hydrogen molecule concentration is in the range between $5 \times 10^{18}$ to $5 \times 10^{19}$ molecules/cm$^3$.

The optical system is composed of groups of quartz glass optical members such as a lens, mirror, prism and the like. It is a second aspect of the invention that the total length of an optical path of the third quartz glass optical member group is equal to or less than 20%, or preferably equal to or less than 15%, of a total length of an optical path of the entire optical system.

A third aspect of the invention is directed to a projection aligner, whereby the optical system comprises a second quartz glass optical member group whose hydrogen molecule concentration is in the range of $5 \times 10^{17}$ to $5 \times 10^{18}$ molecules/cm$^3$. Preferably the total lengths of optical paths of the second and third quartz glass optical member groups each are equal to or less than 20%, or preferably less than 15%, of a total length of the entire optical system.

Fourth and fifth aspects of the invention concern projection aligners with respective, effective combinations of quartz glass optical member groups with different optical qualities in order to achieve necessary resolution power and a high transmittance of the respective entire optical systems as a whole. Each projection aligner has a third group of quartz glass optical members with a lower homogeneity in refractive index distribution ($\Delta$n) and a lower birefringence, but with a higher hydrogen concentration and at least one further group of quartz glass optical members with a higher homogeneity in refractive index distribution ($\Delta$n) and a higher birefringence, but with a lower hydrogen concentration.

In more detail the fourth aspect of the invention is directed to a projection aligner comprising an optical system composed of three groups of quartz glass optical members, showing a specific homogeneity in refractive index distribution $\Delta$n and a specific birefringence as follows:

| Group | $C_{H2}$ (molecules/cm$^3$) | $\Delta$n | birefrigence (nm/cm) |
|---|---|---|---|
| 1st | $1 \times 10^{17} - 5 \times 10^{18}$ | $\leq 1 \times 10^{-6}$ | $\leq 1.00$ |
| 2nd | $5 \times 10^{17} - 5 \times 10^{18}$ | $\leq 3 \times 10^{-6}$ | $\leq 3.00$ |
| 3rd | $5 \times 10^{15} - 5 \times 10^{19}$ | $\leq 5 \times 10^{-6}$ | $\leq 5.00$ |

The transmittance of the entire optical system is equal to or more than 99.0%/cm. Preferably the groups of quartz glass optical members are arranged depending on an energy density per pulse $\epsilon$ (mJ/cm$^2$) of the ArF excimer laser light, whereby optical members of the first group are exposed to an energy density equal or less than 0.2, optical members of the second group are exposed to an energy density between 0.2 and 0.6, and optical members of the third group are exposed to an energy density equal or higher than 0.6.

The fifth aspect of the invention is directed to a projection aligner for integrated circuit fabrication according to the fourth aspect, wherein total lengths of optical paths of the second and third optical member groups both are equal to or less than 20%, or preferably 15%, of a total length of the entire optical system.

A further aspect of the invention is directed to a projection aligner, comprising a first optical member of the third group which is located in the closest position to an image-forming plane of a wafer and/or a pupil plane, exposed to the highest energy density per pulse $\epsilon$ (mJ/cm$^2$) of the ArF excimer laser light transmitted. More particularly, the optical member having the highest hydrogen molecule concentration is exposed to the highest energy density and located in the closest position to an image-forming plane of a wafer and/or a pupil plane. The first optical member is designated hereinafter as "optical member on the wafer side". Its hydrogen content is higher than that in at least one other, second optical member, which is exposed to a lower energy density and which belongs the first or second group of optical members and which is located in the farthest position from the image-forming plane of a wafer and/or the pupil plane. The second optical member is designated hereinafter as "optical member on the optical source side" Its homogeneity in refractive index distribution $\Delta$n is higher and its birefringence (nm/cm) is lower than those of the optical member on the wafer side.

It is preferred that the optical member on the wafer side is made of synthetic quartz glass having a hydrogen molecule concentration in the range of $5 \times 10^{18}$ to $5 \times 10^{19}$ molecules/cm$^3$, having a homogeneity in refractive index distribution $\Delta$n equal to or less than $5 \times 10^{-6}$/cm and a birefringence equal to or less than 5 nm/cm, and the optical member on the light source side is made of synthetic quartz glass having a hydrogen molecule concentration in the range of $1 \times 10^{17}$ to $5 \times 10^{18}$ molecules/cm$^3$, a homogeneity in refractive index distribution $\Delta$n equal to or less than $3 \times 10^{-6}$/cm and a birefringence equal to or less than 3 nm/cm.

A further aspect of the present invention is considering that in a projection aligner for integrated circuit fabrication using refractive optics a diameter of a pupil plane may be in the range of 30 mm to 50 mm. At least some of the optical members of the projection aligner are designed as optical lenses, whereby the lenses of the first group have a diameter equal to or more than 100 mm, the lenses of the second group have a diameter in the range of 80 to 100 mm, and the lenses of the third group have a diameter equal to or less than 80 mm. Preferably for each group the hydrogen molecule concentrations, the homogeneity in refractive index distribution $\Delta$n, and the birefringence may be are adjusted as explained above for the forth aspect of the invention.

A last aspect of the invention refers to a projection aligner, in which at least some of the optical members are designed as optical lenses, whereby the optical lenses of the first group are designed to be exposed to ArF laser light having an energy density per pulse $\epsilon$ lower than 0.2 mJ/cm$^2$, and the optical lenses of the third group are designed to be exposed to ArF laser light having an energy density per pulse $\epsilon$ equal to or more than 0.2 mJ/cm$^2$, whereby the hydrogen content $C_{H2}$ (molecules/cm$^3$) of the lenses is adjusted according to the following equations:

$$19.2+2.98 \times \text{Log } \epsilon \leq \text{Log}(C_{H2})<18.6 \text{ for } \epsilon<0.2 \text{ mJ/cm}^2 \quad (1)$$

$$19.2+2.98 \times \text{Log } \epsilon \leq \text{Log}(C_{H2})<20.7+2.98 \times \text{Log } \epsilon \text{ for } \epsilon \geq 0.2 \text{ mJ/cm}^2 \quad (2)$$

EMBODIMENT OF THE INVENTION

The present invention is below described in embodiments thereof referring to the accompanying drawings, wherein it is to be understood that, unless specified, the sizes, materials and shapes of constructing parts, relative configurations

Figure 1:
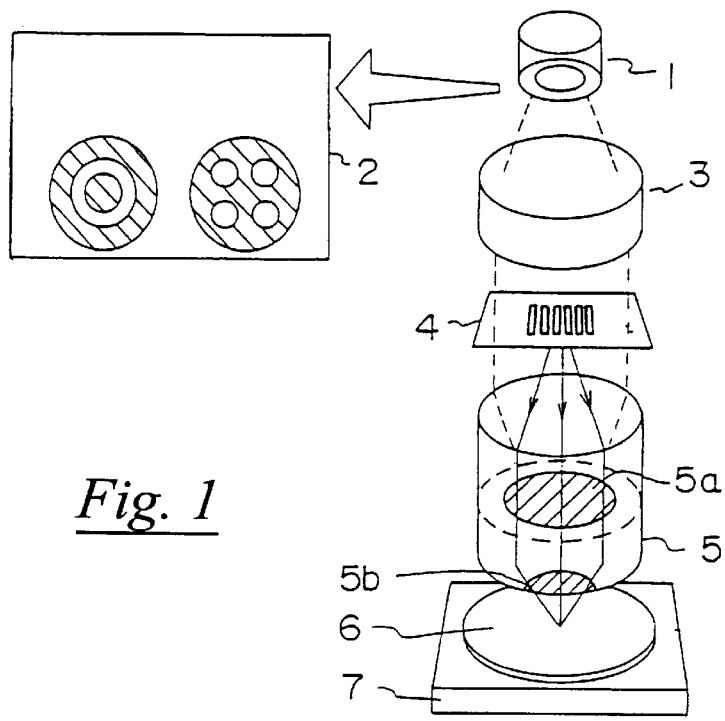
FIG. 1 is a schematic diagram showing a structure of a projection aligner using refractive optics according to the present invention.

In the projection aligner according to FIG. 1 an ArF excimer laser light source is used, wherein 1 indicates the ArF excimer laser light source, 2 indicates a modified illumination means for formation of a pattern image on a wafer without any interference of diffracted light, which illumination means comprises a light source plane of, for example, quadrupole or zonal illumination as viewed in sectional shape with a light-intercepting part in the central portion of the plane.

Designation number 3 indicates a condenser lens, which conducts an excimer laser beam emitted from the above-mentioned light source to a reticle. 4 indicates a reticle, which is a patterned mask, 5 indicates a refractive optical system, wherein, for example, a group of lenses with a positive refraction and another group of lenses with a negative refraction are combined in efforts to attain a narrower spectral bandwidth and a pupil plane is formed in the refractive optical system so as to achieve an improved resolution. 6 indicates a wafer placed on a wafer stage 7 and a mask pattern depicted on the reticle 4 is projected on a wafer 6 to form an pattern image by the help of the refractive optical system.

Such a projection aligner comprises a group of condenser lenses 5b mounted in the vicinity of the pupil plane (hereinafter referred to as lenses on the light soucre side) and a further group of lenses 5a mounted in the closest position to a plane of a wafer (hereinafter referred to as lenses on the wafer side). By the first mentioned condenser lenses an image of the light source is formed, which works as a secondary light source. Accordingly, if the light source image is formed in a dispersed manner in the pupil plane, local concentration of light energy is created and it can be one of causes for breakage of the portion of the optical system, which could be the case in a portion on the wafer side thereof.

On the reticle side of the optical system, operational conditions are milder than those on the wafer side, since an energy density is less by a factor of the second order of an imaging magnification.

In this embodiment, such points as above-mentioned are considered. That is, it is reasonable that an energy density is determined in reference to a magnification ratio to an area of a pupil plane, wherein, according to a reference article, a size of the pupil plane of an ArF excimer laser beam is in the range of 30 to 50 mm in diameter.

Provided that a resist sensitivity is in the range of 20 to 50 mJ and a photoresist film is exposed to 20 to 30 pulse laser irradiation, an energy density per pulse on the pupil plane is 0.7 to 1.7 mJ/cm$^2$. An energy density per pulse in the lenses located in the closest position to the surface of the wafer is, in practice, estimated to be in the range of 80 to 90% of the above energy density, that is, in the range of 0.6 to 1.5 mJ/cm$^2$, even when it is assumed that, to be exact, there is a difference between energy densities on an image-forming plane and the pupil plane and the energy density on the wafer plane is larger than on the pupil plane. An energy density on the pupil plane seems to be less than the range of 0.6 to 1.5 mJ/cm$^2$ by a small difference.

An optical system is constructed with a combination of lenses having a positive refraction and other lenses having a negative refraction for a narrower spectral bandwidth and improved resolution (see, for example, the publication of Unexamined Japanese Patent Application 3-34308). In this case, removal of aberrations is required at a great extent and, for the purpose, ratios of enlargement or reduction of respective lenses incorporated are properly selected in moderate ranges. In consideration of such circumstances, an energy density per pulse in the third group of lenses, which are in a position next to the closest position to the wafer or pupil plane is estimated to be in the range of about one third of the above-mentioned range of 0.6 to 1.5 mJ/cm$^2$, that is, in the range of 0.2 to 0.6 mJ/cm$^2$.

An energy density per pulse $\epsilon$ in almost all the other groups of lenses, especially lenses on the light source side, which are located far from a pupil and a wafer is less than 0.2 mJ/cm$^2$.

In the above conditions of energy densities per pulse, a transmittance of the entire optical system can be improved, attaching much importance to an optical transmittance rather than to durability for a group of lenses having an energy density per pulse less than 0.2 mJ/cm$^2$ among groups of lenses on the wafer side. Therefore, in this embodiment, optical members locating on the side of the light source having an energy density per pulse equal to or less than 0.2 mJ/cm$^2$, which are located far from the wafer and the pupil plane, are selected to be of high quality at a variation of refractive index $\Delta$n equal to or less than 1×10$^{-6}$ and a birefringence equal to or less than 1.00 nm/cm, whereas a hydrogen molecule concentration C$_{H2}$ is set at a value as low as in the range of 1×10$^{17}$ to 5×10$^{18}$ molecules/cm$^3$.

Groups of lenses in the vicinity of the pupil plane and lenses in the closest position to the wafer whose energy density per pulse $\epsilon$ is in the range of 0.6 to 1.5 mJ/cm$^2$ can be improved on durability as a whole, by taking a serious view thereof. In this embodiment, accordingly, a concentration of hydrogen molecules C$_{H2}$ is set as high as in the range of 5×10$^{18}$ to 5×10$^{19}$ molecules/cm$^3$ for an optical system whose energy density per pulse $\epsilon$ is as high as in the range of 0.6 to 1.5 mJ/cm$^2$, whereas other two optical properties are moderately set for easy manufacture, that is, a variation of refractive index $\Delta$n is set at a value equal to or less than 5×10$^{-6}$ and a birefringence is set at a value equal to or less than 5.0 nm/cm for the same optical system.

For optical members such as lenses, which are located in positions next to the optical members with a high energy density per pulse, or in other words which have an energy density per pulse $\epsilon$ of received light in the range of 0.2 to 0.6 mJ/cm$^2$ between the above-mentioned ranges, a concentration of hydrogen molecules C$_{H2}$ is moderately set in the range of 5×10$^{17}$ to 5×10$^{18}$ molecules/cm$^3$ and a variation of refractive index and birefringence are also moderately set to be equal to or less than, respectively, 3×10$^{-6}$ respectively 3.0 nm/cm, which makes manufacture of the optical system easier.

Besides, groups of optical members having different optical properties are combined in order to attain high transmittance without any reduction in durability as a whole optical system, as later described in a second embodiment, wherein a total length of optical path through optical members having an energy density per pulse $\epsilon$ in the range of 0.6 to 1.5 mJ/cm$^2$ is equal to, or less than 20%, or preferably 15%, of a total length of optical path through the entire optical system and a total length of optical path through optical members having an energy density per pulse ε in the range of 0.6 to 1.5 mJ/cm2 is equal to or less than 20%, or preferably equal to or less than 15%, of a total length of optical path through the entire optical system.

Material of lenses composing the above refractive optical system should be selected in consideration of a degree of degradation in optical properties of a lens for a given magnitude of its diameter. Along this line, a diameter of a lens should be reasonably determined by the use of a magnifying factor to the area of an pupil, wherein an pupil plane of an ArF excimer laser is in the range of 30 to 50 mm in diameter according to the aforementioned reference.

A lens at an adjacent position to the pupil plane and an image-forming plane of a wafer, which transmits ArF excimer laser light at an energy density ε in the range of 0.6 to 1.5 mJ/cm$^2$ has the maximum of 80 mm in diameter, when considering that the maximum diameter of the pupil is 50 mm, provided that a working area of the lens is 80%. Accordingly, it is generally estimated that the diameter of a lens as an optical member at an energy density ε in the range of 0.6 to 1.5 mJ is equal to or less than about 80 mm.

A lens at an energy density ε in the range of 0.2 to 0.6 mJ/cm$^2$ has an magnifying factor of about 2 to 3 and accordingly a diameter of the lens properly is in the range of 80 to 100 mm, according to a similar calculation.

A lens lager than 100 mm in diameter should naturally be used for transmission of ArF laser light having a lower energy density ε equal to or less than 0.2 mJ/cm$^2$.

In such conditions of a diameter and an energy density, too, a total optical path length through optical members such as lenses having a diameter of 80 mm is equal to or less than 20%, or preferably 15%, of a total optical path length of the entire optical system and a total optical path length through optical members such as lenses having a diameter in the range of 80 to 100 mm is also equal to or less than 20%, or preferably 15%, of a total optical path length of the entire optical system.

The present invention may be applicable to a projection aligner using reflective optics in addition to the projection aligner using refractive optics shown in FIG. 1.

Figure 2:
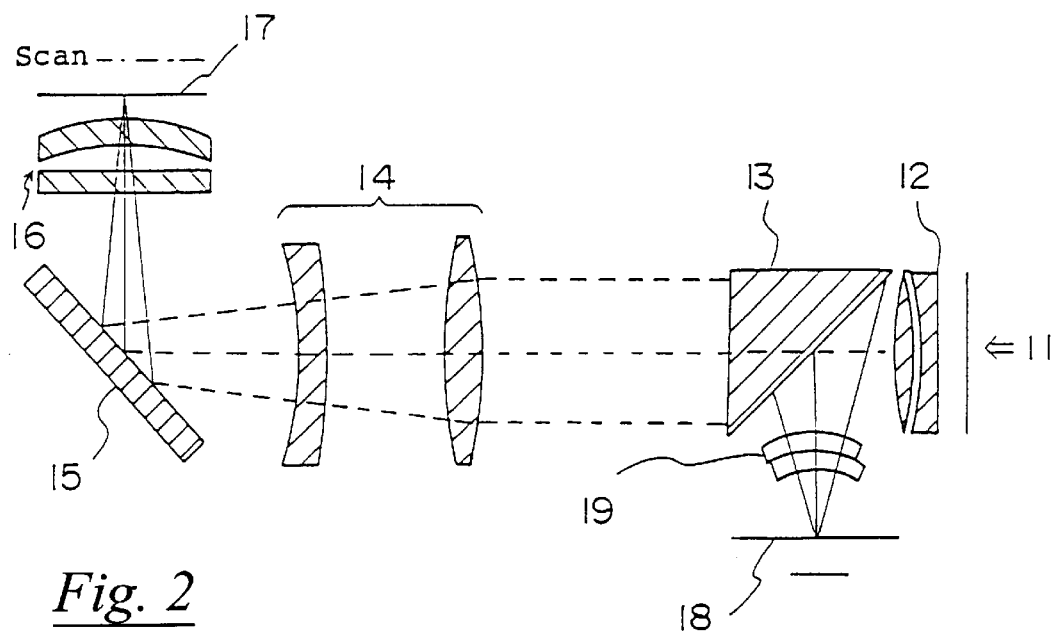
FIG. 2 is a schematic diagram showing a structure of a projection aligner using reflective optics according to the present invention.

The projection aligner using reflective optics is described in reference to FIG. 2. FIG. 2 is a schematic diagram showing a configuration of lenses and the like of a projection aligner using reflective optics, in which the aligner uses a beam splitter of a prism type in order to attain a high resolution. Simply described, a beam is emitted from a light source 11 and the beam passes firstly a first group of lenses 12, secondly the beam slitter 13, thirdly a second group of lenses 14 and then reaches a mirror 15. The beam is deflected at the mirror 15 and condensed with a third group of lenses 16. Thereafter, a recticle 17 is scanned with the condensed beam and after scanning the reflected beam passes back again the third group of lenses 16, reaches the mirror 15 to be reflected and again passes the second group of lenses 14 to reach the beam splitter 13. The beam is at this time reflected in the beam splitter 13 and passes a fourth group of lenses 19 to form a pattern image of integrated circuits on a wafer 18, which image results in a resist pattern after activation of a photosensitive resist applied on the wafer and a treatment in a developer solution.

In such a projection aligner, the fourth group of lenses 19, which the beam passes after the deflection in the beam splitter 13, has a hydrogen molecule concentration $C_{H2}$ as high as in the range of $5 \times 10^{18}$ to $5 \times 10^{19}$ molecules/cm$^3$, whereas a variation of refractive index Δn is moderately set to be equal to, or less than $5 \times 10^{-6}$ and a birefringence is also moderately set to be equal to, or less than 5.0 nm/cm, since the fourth group of lenses 19 receives a light energy ε as high as in the range of 0.6 to 1.5 mJ/cm$^2$, which is the highest in the entire optical system. The third group of lenses 16 has a hydrogen molecule concentration $C_{H2}$ in the range of $5 \times 10^{17}$ to $5 \times 10^{18}$ molecules/cm$^3$, a variation of refractive index Δn as moderate as to be equal to, or less than $3 \times 10^{-6}$ and a birefringence as moderate as to be equal to, or less than 3.0 nm/cm, since the beam with an estimated energy density per pulse ε in the range 0.2 to 0.6 mJ/cm$^2$ passes the bulk of the third group of lenses 17, which estimation is based on the functions that the beam is condensed by the third group of lenses 17 and then used for scanning on the recticle 17. In other optical members in the optical system, such as other lenses, the mirror and beam splitter of a prism type, a hydrogen molecule concentration $C_{H2}$ is set to be in the range of $1 \times 10^{17}$ to $5 \times 10^{18}$ molecules/cm$^3$, a variation of refractive index Δn is set to be as of high quality as to be equal to, or less than $1 \times 10^{-6}$ and a birefringence is set to be also as of high quality as to be equal to, or less than 1.00 nm/cm, since such optical members are affected by the beam with an energy density per pulse ε as low as to be equal to, or less than 0.2 mJ/cm$^2$.

It is estimated that the third and fourth groups of lenses having different optical properties are combined to construct the optical system with a high transmittance achieved but without any reduction in durability in this embodiment, wherein a total length of optical path through the fourth group of lenses 19 is equal to, or less than 20%, or preferably 15%, of a total length of optical path through the entire optical and a total length of optical path through the third group of lenses 16 is equal to, or less than 20%, or preferably 15%, of the total length of optical path through the entire optical system.

A relation between a lens diameter and an energy density per pulse of transmission of ArF laser light is similar to the case of a refractive type projection aligner. A total optical path length through the fourth group of lenses 19 having a set diameter of 80 mm or less is equal to or less than 20%, or preferably 15%, of a total optical path length of the entire optical system. A total optical path length through the third group of lenses 16 having a set diameter of 80 to 100 mm is equal to or less than 20%, or preferably 15%, of a total optical path length of the entire optical system. A combination of the third and fourth groups of lenses is assumed to realize a transmittance of 99.8% of the optical system as a whole without any degradation in durability.

EXAMPLES OF THE INVENTION

Long term stability of optical properties in actual conditions was simulated by an acceleration test conducted in severer conditions on quartz glass optical members, such as a lens, mirror and prism, which were extracted from an optical system incorporated in each of the projection aligners depicted in FIGS. 1 and 2, since a long term stability test on each of projection aligners depicted in FIGS. 1 and 2 takes a long time, if tested in actual operational conditions.

A progress speed of a damage by irradiation of laser light generally increases in proportion to the second power of an energy density of excimer laser light according to the teaching of an article in Japanese authored by Akira FUJINOKI with a title of "Quartz Glass for the Excimer Laser Use" published in "Optics", Vol. 23, No. 10. The acceleration test was conducted on the basis of the acceleration effect on the damage progress speed in the teaching.

Silicon tetrachloride was hydrolyzed in an oxygen/hydrogen flame and silica formed was further deposited on a rotating substrate to produce a quartz glass ingot, which is called DQ method.

The produced quartz glass ingot contained OH group at a concentration in the range of 800 to 1000 ppm and hydrogen molecules at a concentration of $5 \times 10^{18}$ molecules/cm$^3$. It received a homogenizing treatment comprising heating at 1150° C. for 40 hours and gradual cooling by a method disclosed in the publication of Unexamined Japanese Patent Application 7-267662 in order to remove strains in the bulk.

Optical properties were measured on the homogeneous quartz glass obtained. According to the measurements, it was found that it had no striae in three directions, a very good homogeneity in refractive index distribution Δn of $1 \times 10^{-6}$ was measured by an interferometer (ZYGO MARK IV) and a birefringence of 1 nm/cm was measured by a cross Nicols bi-refringences analyzer.

Such optical quartz glass meets requirements for optical properties of quartz glass used as material of optical members incorporated in an excimer laser stepper, which requirements are described in an article in Japanese authored by Kazuo USHIDA titled "Quarts Glass for a Stepper", published in New Glass, Vol. 6, No. 2 (1989) pp. 191–196. A projection aligner for semiconductor use having an ArF excimer laser as a light source can be constructed with optical members made of such optical quartz glass.

The quartz glass thus produced was measured on a hydrogen molecule concentration included therein by a laser Raman spectroscopic analysis and the concentration was found to be $5 \times 10^{17}$ molecules/cm$^3$ (a specimen used for the measurement is hereinafter called Sample A).

A hydrogen molecule concentration was measured by a Raman spectrophotometer. The Raman spectrophotometer used in the measurements was a Raman spectrophotometer NR 1100 made by "Nihon Bunkou Kougyo K.K." and a photon counting method was adopted, wherein an Ar-laser with an output of 700 mW at an excitation wavelength of 488 nm and a "photo-multilplier R943-02" made by "Hamamatsu photonics K.K." were used. A measurement was conducted by conversion to a hydrogen molecule concentration of a ratio of integrated intensities between a scattering band of SiO$_2$ at a wavenumber of 800 cm$^{-1}$ and a scattering band of hydrogen in a range of 4135 to 4140 cm$^{-1}$ in wavenumber observed in a Raman scattering spectrum, wherein a conversion constant was $1.22 \times 10^{21}$ and, therefore, $C_{H2}$=Integral Intensity of SiO$_2$/Integral Intensity of Hydrogen times $1.22 \times 10^{21}$, said constant being reported in Zhurnal Pri-Kladnoi Spectroskopii, Vol. 46, No. 6, pp. 987–991, June 1987.

The above quartz glass was cut to prepare a specimen having a size of 60 mm in diameter and 20 mm in thickness. The specimen was oxidized in atmospheric air at 1000° C. for 20 hours and the oxidized specimen was put into an autoclave to give a hydrogen doping treatment in a high pressure hydrogen atmosphere of about 5 MPa (50 kgf/cm$^2$) at 600° C. for 1000 hours. The specimen thus treated was measured on a variation of refractive index Δn, a birefringence and a hydrogen molecule concentration $C_{H2}$, which were respectively $4 \times 10^{-6}$, 5 nm/cm and $2 \times 10^{19}$ molecules/cm$^3$ (the specimen is hereinafter called Sample D).

The above quartz glass was further cut to prepare a specimen having the same size as Sample D and the specimen was oxidized in the same conditions as those of Sample D. The oxidized specimen was then put into an autoclave to give a hydrogen doping treatment in a pressurized hydrogen atmosphere of about 0,9 MPa at 600° C. for 1000 hours. The specimen thus treated was measured on a variation of refractive index Δn, a birefringence and a hydrogen molecule concentration $C_{H2}$, which were respectively $3 \times 10^{-6}$, 3 nm/cm and $5 \times 10^{18}$ molecules/cm$^3$ (the specimen is hereinafter called Sample B).

The above quartz glass was further cut into a specimen having the same size as Sample D and the specimen was oxidized in the same conditions as those of Sample D. The oxidized specimen was then put into an autoclave to give a hydrogen doping treatment in a pressurized hydrogen atmosphere of 0,3 MPa at 600° C. for 1000 hours. The specimen thus treated was measured on a variation of refractive index Δn, a birefringence and a hydrogen molecule concentration $C_{H2}$, which were respectively $2 \times 10^{-6}$, 2 nm/cm and $2 \times 10^{18}$ molecules/cm$^3$ (the specimen is hereinafter called Sample C).

As can be seen from the above measurements, each of the other quartz glasses than Samples A and C does not have enough homogeneity to make, as a single material, optical members for a projection aligner with an ArF excimer laser as a light source and a birefringence is too large for the purpose. However, if quartz glasses of Samples A, B, C and D were respectively used as materials of different optical members in a projection aligner in FIG. 1 in a ratio of 4:2:1:1 in terms of optical path length in an optical system, homogeneity of the entire optical system satisfactorily meets the requirements for a projection aligner, for the average homogeneity of the entire optical system was so calculated that a variation of refractive index Δn is $2 \times 10^{-6}$ and a birefringence is 2 nm/cm.

A transmittance was measured on each of the four samples with ultraviolet having a wavelength of 193 nm, and the measurements were 99.8% per cm in internal transmittance, which was satisfactorily high. Accordingly, the four samples have a high transmittance enough for material of optical members constructing an optical system in a projection aligner.

The four samples were exposed to irradiation of ArF excimer laser light to investigate changes in optical properties. Condition of the irradiation were an energy density per pulse of 10 mJ/cm$^2$ and an irradiation frequency of 300 Hz. As can be seen from of the article in Japanese authored by Akira FUJINOKI titled "Quartz Glass for the Excimer Laser Use" published in "Optics", Vol. 23, No. 10, the irradiation conditions are equivalent to those of a acceleration test having an effect of a factor of $(100/\epsilon)^2$, as compared with influences of actual working conditions of the projection aligner wherein a laser beam is transmitted through optical members at an energy density per pulse $\epsilon$.

Table 1 shows changes in optical properties such as transmittance and a refractive index of different samples by irradiation of excimer laser light over $2.5 \times 10^7$ shots.

TABLE 1

| Samples | $C_{H2}$ (mol/cm$^3$) | Change in Δn per cm | Change in Δn per pulse | Reduction in transmittance (%) |
| --- | --- | --- | --- | --- |
| A | $5 \times 10^{17}$ | $2.5 \times 10^{-6}$ | $1.01 \times 10^{-13}$ | 2.9 |
| B | $2 \times 10^{18}$ | $9.3 \times 10^{-7}$ | $6.64 \times 10^{-14}$ | 1.4 |
| C | $5 \times 10^{18}$ | $5.6 \times 10^{-7}$ | $2.24 \times 10^{-13}$ | 0.4 |
| D | $2 \times 10^{19}$ | $\leq 3 \times 10^{-7}$ | $\leq 1.2 \times 10^{-14}$ | 0.0 |

A change in variation of refractive index Δn could not exactly be measured on the sample D, since the change was too small to measure.

As seen from the data shown in the table, changes in variation of refractive index by irradiation of ArF laser light are the most important among parameters relevant to performance stability of a projection aligner.

A relation between hydrogen molecule concentrations and increasing rates of refractive index was obtained from the data on Samples A to C and the relation was extrapolated for calculation, since the data from Sample D was not reliable enough in terms of accuracy.

Expected changes in refractive index after irradiation of $1 \times 10^{10}$ shots (which corresponds to three years of continuous irradiation at 100 Hz) of an ArF excimer laser beam at an energy density of 0.2 mJ/cm$^2$ are shown in Table 2, since an acceleration rate is considered to be $(100/\epsilon)^2$ from the conditions adopted in the accelerated simulation experiments, as compared with influences on quartz glass optical members in actual conditions of a projection aligner, wherein ArF excimer laser light passes quartz glass optical members at an energy density $\epsilon$ mJ/cm$^2$.

TABLE 2

| Samples | Expected changes after irradiation | usable or not |
|---|---|---|
| A | $4.04 \times 10^{-7}$ | usable |
| B | $1.60 \times 10^{-7}$ | usable |
| C | $8.68 \times 10^{-8}$ | usable |
| D | $3.42 \times 10^{-8}$ | usable |

Calculations were made to obtain the above data in the table by first finding a relation between hydrogen concentrations and increasing rates of refractive index from the measurements on the samples using the data on Samples A to C and thereafter extrapolating the relation, since the measurements on Sample D were not conducted with an enough accuracy.

Expected changes in refractive index after irradiation of $1 \times 10^{10}$ shots of an ArF excimer laser beam at an energy density of 0.6 mJ/cm2 are shown in Table 3.

TABLE 3

| Samples | Expected changes after irradiation | usable or not |
|---|---|---|
| A | $3.63 \times 10^{-6}$ | usable |
| B | $1.14 \times 10^{-6}$ | usable |
| C | $7.81 \times 10^{-6}$ | usable |
| D | $3.08 \times 10^{-7}$ | usable |

Expected changes in refractive index after irradiation of $1 \times 10^{10}$ shots of an ArF excimer laser beam at an energy density of 1.0 mJ/cm$^2$ are shown in Table 4.

TABLE 4

| Samples | Expected changes after irradiation | usable or not |
|---|---|---|
| A | $1.01 \times 10^{-5}$ | not usable |
| B | $4.00 \times 10^{-6}$ | not usable |
| c | $2.17 \times 10^{-6}$ | not usable |
| D | $8.56 \times 10^{-7}$ | usable |

According to the above simulating experiments, a projection aligner having an optical system composed of a plurality of kinds of synthetic quartz glass optical members respectively having different ranges of each optical property, is expected to run over a long term with enough stability of the optical properties in an actual working condition, wherein the ranges of each optical property are claimed in the appended claims in the narrowest sense.

The following equation was obtained by investigating a relation between changing rates of refractive index and hydrogen concentrations at an energy density of 10 mJ/cm$^2$ of transmission of ArF laser light in the data of Samples A to C.

$$\mathrm{Log}[dn/dp_{10\ mJ}] = -1.13 - 0.67 \times \mathrm{Log}[C_{H2}]$$

Changing rates of refractive index was found to be generally expressed in another following equation, since an acceleration factor is considered to be $(100/\epsilon^*)^2$ as compared to an actual working condition of a projection aligner at an energy density $\epsilon$ (mJ/cm$^2$) of transmission of ArF excimer laser light judging from the conditions adopted in the accelerated simulation experiments.

$$\mathrm{Log}[dn/dp_{\epsilon mJ}] = -3.13 - 0.67 \times \mathrm{Log}[C_{H2}] + 2 \times \mathrm{Log}[\epsilon]$$

For a projection aligner constructed with optical members made of quartz glass having an ArF excimer laser as a light source, it has been discovered that a changing rate of refractive index on a dose of irradiation should preferably be in the range according to an equation that $$17 \leq \mathrm{Log}[dn/dp_{\epsilon mJ}] \leq -16,$$

provided that a change in refractive index over irradiation is equal to or less than $1 \times 10^{-6}$ per a irradiation dose of $1 \times 10^{10}$ to $1 \times 10^{11}$ shots, since it is judged that an enough stability of the projection aligner in a practical sense for semiconductor device fabrication is secured, said irradiation dose corresponding to an irradiation of half a year at a frequency of 600 Hz to an irradiation of more than five years at a frequency of 600 Hz.

From the above discovery, it has been found that a hydrogen molecule concentration $C_{H2}$ in quartz glass optical members constructing a projection aligner with an ArF excimer laser as a light source properly is in the range according to an equation that $$19.2 + 2.98 \times \mathrm{Log}\ \epsilon \leq \mathrm{Log}(C_{H2}) \leq 20.7 + 2.98 \times \mathrm{Log}\ \epsilon,$$

wherein an energy density per pulse of ArF excimer laser beam for irradiation is $\epsilon$ mJ/cm2, in order that the quartz glass optical members has enough stability for a practical use.

According the latter above equation, Table 5 is given, which shows hydrogen molecule concentrations required for various $\epsilon$-values.

TABLE 5

| $\epsilon$ | 0.05 | 0.1 | 0.2 | 0.3 | 0.4 | 0.5 | 0.6 | 0.7 | 0.8 | 0.9 | 1.0 |
|---|---|---|---|---|---|---|---|---|---|---|---|
| $C_{H2Max}$ | 6.42 E16 | 5.08 E17 | 4.02 E18 | 1.35 E19 | 3.18 E19 | 6.19 E19 | 1.07 E20 | 1.69 E20 | 2.52 E20 | 3.58 E20 | 4.90 E20 |
| $C_{H2Min}$ | 2.08 E15 | 1.64 E16 | 1.30 E17 | 4.36 E17 | 1.03 E18 | 2.00 E18 | 3.45 E18 | 5.47 E18 | 8.14 E18 | 1.16 E19 | 1.58 E19 |

In ranges as low as of $\epsilon<0.2$ mJ/cm², an optical member with a hydrogen molecule concentration of $4\times10^{18}$ molecules/cm³ can be substituted for that with each of the maximum hydrogen molecule concentrations in ranges corresponding to the ranges of $\epsilon<0.2$ mJ/cm², since an optical member with a hydrogen molecule concentration of $4\times10^{18}$ molecules/cm³ can be produced without any more burden in production, as compared to an optical member with a lower hydrogen molecule concentration. The latter above equation for the range of $\epsilon<0.2$ mJ/cm² may, therefore, be rewritten in the following way:

$$19.2+2.98\times\text{Log } \epsilon \leq \text{Log}(C_{H2}) < 18.6$$

Effect of the Invention

According to a projection aligner of the present invention, which has been detailed in the foregoing description, even the projection aligner with an ArF excimer laser as a light source can be constructed using an optical system composed of optical members made of hydrogen doped quartz glass with not only a low cost but ease as a whole system, and moreover without any degradation in durability and optical qualities over time.

We claim:

1. A projection aligner for integrated circuit fabrication, in which an integrated circuit pattern image is projected on a wafer, comprising an ArF excimer laser and an optical system composed of groups of quartz glass optical members made of synthetic quartz glass, characterized in that the optical system comprises a first quartz glass optical member group whose hydrogen molecule concentration is in the range between $1\times10^{17}$ and $5\times10^{18}$ molecules/cm³ and a third quartz glass optical member group whose hydrogen molecule concentration is in the range between $5\times10^{18}$ to $5\times10^{19}$ molecules/cm³.

2. A projection aligner according to claim 1, characterized in that the total length of an optical path of the third quartz glass optical member group is equal to or less than 20%, or preferably less than 15%, of a total length of an optical path of the entire optical system.

3. A projection aligner according to claim 1, characterized in that the optical system comprises a second quartz glass optical member group whose hydrogen molecule concentration is in the range of $5\times10^{17}$ to $5\times10^{18}$ molecules/cm³.

4. A projection aligner according to claim 3, characterized in that the groups of quartz glass optical members show a specific homogeneity in refractive index distribution Δn and a specific birefringence as follows:

| Group | $C_{H2}$ (molecules/cm³) | Δn | birefringence (nm/cm) |
|---|---|---|---|
| 1st | $1\times10^{17} - 5\times10^{18}$ | $\leq 1\times10^{-6}$ | $\leq 1.00$ |
| 2nd | $5\times10^{17} - 5\times10^{18}$ | $\leq 3\times10^{-6}$ | $\leq 3.00$ |
| 3rd | $5\times10^{18} - 5\times10^{19}$ | $\leq 5\times10^{-6}$ | $\leq 5.00$ |

5. A projection aligner according to claim 4, characterized in that the groups of quartz glass optical members are arranged depending on an energy density per pulse $\epsilon$ (mJ/cm²) of the ArF excimer laser light, whereby optical members of the first group are exposed to an energy density equal or less than 0.2, optical members of the second group are exposed to an energy density between 0.2 and 0.6, and optical members of the third group are exposed to an energy density equal or higher than 0.6.

6. A projection aligner according to claim 4, characterized in that at least some of the optical members are designed as optical lenses, whereby the lenses of the first group have a diameter equal to or more than 100 mm, the lenses of the second group have a diameter in the range of 80 to 100 mm, and the lenses of the third group have a diameter equal to or less than 80 mm.

7. A projection aligner according to claim 3, characterized in that the total lengths of optical paths of the second and third quartz glass optical member groups each are equal to or less than 20%, or preferably less than 15%, of a total length of the entire optical system.

8. A projection aligner according to claim 1, characterized in that a first optical member of the third group is located in the closest position to an image-forming plane of a wafer and/or a pupil plane, exposed to the highest energy density per pulse $\epsilon$ (mJ/cm²) of the ArF excimer laser light transmitted.

9. A projection aligner according to claim 8, characterized in that a second optical member of the first group is located in the farthest position to an image-forming plane of a wafer and/or a pupil plane, exposed to a lower energy density per pulse $\epsilon$ (mJ/cm²) of the ArF excimer laser light, whereby said second optical member has a lower birefringence and a higher homogeneity in refractive index distribution Δn than said first optical member.

10. A projection aligner according to claim 9, characterized in that the first optical member has a homogeneity in refractive index distribution Δn equal to, or less than $5\times10^{-6}$/cm and a birefringence equal to, or less than 5 nm/cm and the second member has a homogeneity in refractive index distribution Δn equal to or less than $3\times10^{-6}$/cm and a birefringence equal to or less than 3 nm/cm.

11. A projection aligner according to claim 1, characterized in that at least some of the optical members are designed as optical lenses, whereby the optical lenses of the first group are designed to be exposed to ArF laser light having an energy density per pulse $\epsilon$ lower than 0.2 mJ/cm², and the optical lenses of the third group are designed to be exposed to ArF laser light having an energy density per pulse $\epsilon$ equal to or more than 0.2 mJ/cm², whereby the hydrogen content $C_{H2}$ (molecules/cm³) of the lenses is adjusted according to the following equations:

$$19.2+2.98\times\text{Log } \epsilon \leq \text{Log}(C_{H2}) < 18.6 \text{ for } \epsilon<0.2 \text{ mJ/cm}^2 \quad (1)$$

$$19.2+2.98\times\text{Log } \epsilon \leq \text{Log}(C_{H2}) \leq 20.7+2.98\times\text{Log } \epsilon \text{ for } \epsilon \geq 0.2 \text{ mJ/Cm}^2. \quad (2)$$

* * * * *